(12) United States Patent
Iwata et al.

(10) Patent No.: US 6,605,412 B2
(45) Date of Patent: Aug. 12, 2003

(54) RESIST PATTERN AND METHOD FOR FORMING WIRING PATTERN

(75) Inventors: Keiji Iwata, Omihachiman (JP); Toshio Hagi, Kusatsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 213 days.

(21) Appl. No.: 09/784,408

(22) Filed: Feb. 13, 2001

(65) Prior Publication Data
US 2001/0016300 A1 Aug. 23, 2001

(30) Foreign Application Priority Data

Feb. 18, 2000 (JP) ........................................ 2000-041022
May 18, 2000 (JP) ........................................ 2000-146504

(51) Int. Cl.⁷ .................................................. G03C 5/56
(52) U.S. Cl. ........................ 430/311; 430/312; 430/313; 430/322; 430/324; 430/330; 430/270.1
(58) Field of Search ................ 430/311, 312, 430/313, 322, 324, 330, 270.1

(56) References Cited

U.S. PATENT DOCUMENTS

| 4,244,799 | A |   | 1/1981 | Fraser et al. | ............ | 204/192 E |
| 4,615,782 | A |   | 10/1986 | Namatsu et al. | ........ | 204/192.36 |
| 4,738,916 | A | * | 4/1988 | Namatsu et al. | ......... | 430/272.1 |
| 5,972,568 | A | * | 10/1999 | Seniuk et al. | ............... | 430/312 |
| 6,228,552 | B1 | * | 5/2001 | Okino et al. | ................ | 430/176 |

FOREIGN PATENT DOCUMENTS

| EP | 0 940 719 A2 | 9/1999 |
| JP | 63-164319 | 7/1988 |
| JP | 63-278335 | 11/1988 |
| JP | 2137224 | 5/1990 |
| JP | 2-137224 | 5/1990 |

* cited by examiner

*Primary Examiner*—Mark F. Huff
*Assistant Examiner*—Daborah Chacko Davis
(74) *Attorney, Agent, or Firm*—Keating & Bennett, LLP (57) ABSTRACT

A resist pattern is provided on a substrate and includes a first resist layer provided on the substrate and defined by a first organic material which dissolves in an organic solvent, water, or a solvent primarily composed of water, a second resist layer defined by a second organic material provided on the first resist layer, the second organic material having a high absorbance of a light having a predetermined wavelength, and a third resist layer defined by a third organic material provided on the second resist layer, the organic material having a resistance to dry etching and being photosensitive to the light.

14 Claims, 6 Drawing Sheets

RESIST PATTERN AND METHOD FOR FORMING WIRING PATTERN

BACKGROUND OF THE INVENTION

1. Field of the Invention

The present invention relates to resist patterns of fine wiring patterns formed on substrates by using a lift off method or other suitable method, and relates to methods for forming such a novel a wiring pattern.

2. Description of the Related Art

Conventionally, a lift-off method for forming metal wiring on various substrates, such as semiconductor substrates, dielectric substrates, and pyroelectric substrates, has been used. When a wiring pattern is formed on a substrate by a lift off method, to ensure superior resist stripability, the cross-section of the resist pattern must have inversely tapered configurations.

Figure 1A:
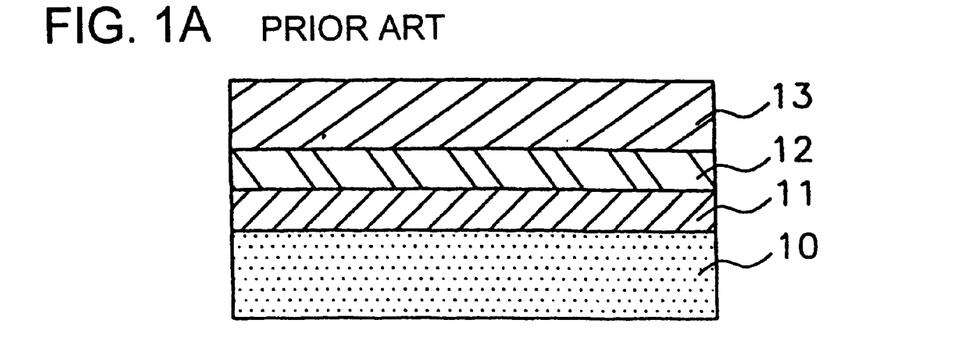
FIGS. 1A to 1C are cross-sectional views of manufacturing steps for a resist pattern according to a conventional example.
Figure 1B:
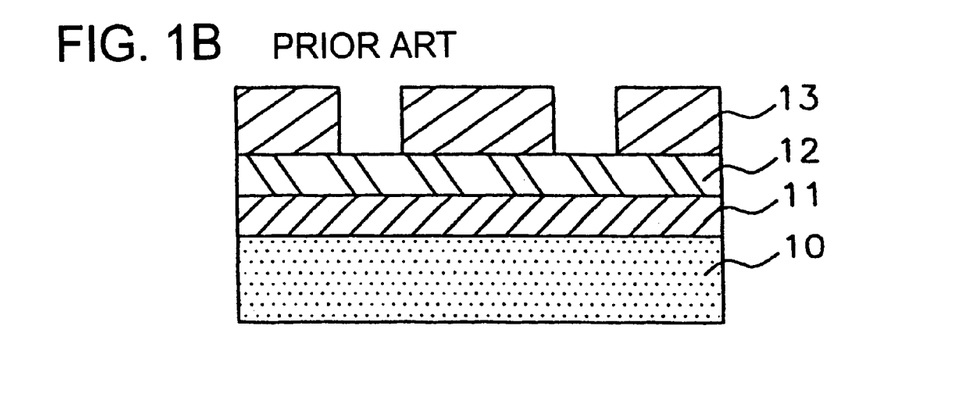
Figure 1C:
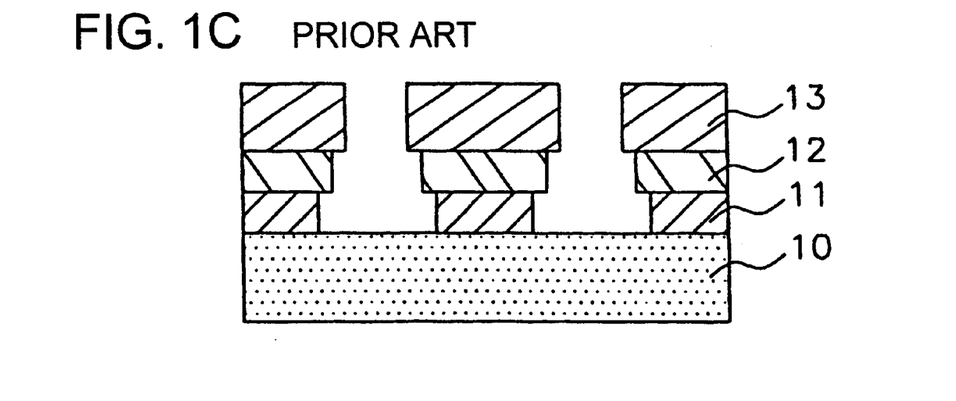
Figure 2:
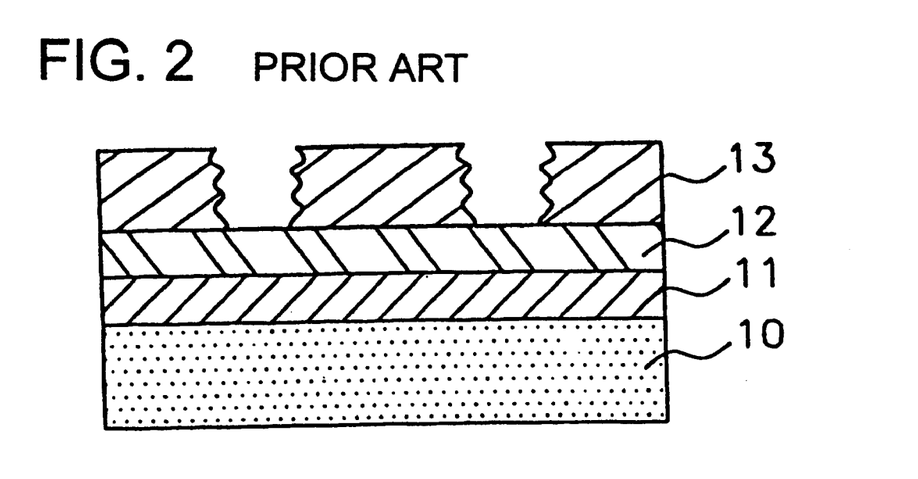
FIG. 2 is a cross-sectional view showing a structure of a resist pattern according to a conventional example.

Various methods for forming an inversely tapered cross-sectional shape of the resist pattern have been used. As an example, a method is disclosed in Japanese Unexamined Patent Application Publication No. 2-137224 in which a resist is defined by a plurality of organic layers. In the method described above, as schematically shown in FIG. 1A, a first resist layer 11 having outstanding stripability, a second resist layer 12 having outstanding heat resistance, and a third resist layer 13 composed of a resist having a high resistance to dry etching and having superior heat resistance or composed of an ionizing radiation resist are sequentially formed on and above a semiconductor substrate 10 from the substrate side, in that order. In the three-layer laminated structure described above, after the third resist layer 13 disposed as the topmost layer is first patterned by a photolithographic method or other suitable method (FIG. 2B), dry etching is performed on the resist. As a result, the second and the first resist layers are removed through openings in the third resist layer 13, whereby patterning of the resist is performed. In the step described above, since the third resist layer 13 has higher resistance to dry etching, the etching rate thereof is controlled to be very low, and on the other hand, since the second and the first resist layers are etched at normal etching rates, as a result, a resist pattern having inversely tapered cross-sectional configurations, as shown in FIG. 1C, are produced.

As described above, in the conventional resist patterns, since resist patterns are produced having inversely tapered cross-sectional configurations and also having superior heat resistance, there are advantages in which patterns of metal wiring, an inorganic compound, an organic compound are formed at a higher temperature.

In a lift off method, a photolithographic process is generally used, and problems occur in the exposure in the photolithographic process. In particular, light incident on the resist and reflected light (which is produced when the incident light is reflected by the substrate) interfere with each other, and in some cases standing waves are generated. Due to the presence of standing waves, the side surfaces of openings in the resist have wave shapes. When the resist has wave shapes, desired line widths formed by a lift off method cannot be controlled.

Conventionally, a method for reducing the wave shapes is used to offset the problems caused thereby in which a photosensitive agent is uniformly diffused by a baking treatment (PEB treatment) performed after exposure.

However, recently, concomitant with the formation of finer wiring patterns, the formation of thinner resist films and improvements in transparency thereof are available. When the formation of thinner resist films and the improvement in transparency thereof are used, the amount of light reflected from the substrate is increased, and as a result, it is difficult to reduce the effects of the standing waves merely by the conventional PEB treatment.

To reduce the effects of the standing waves described above, a method in which a transparent substrate is used having a roughened rear surface has been used. However, when this type of transparent substrate is used, even though the effects of the standing waves are reduced, a new problem occurs in which exposure light is diffusely reflected at the rear surface of the substrate, and the resist is re-exposed from the rear surface side of the substrate (when re-exposure occurs by diffuse reflection, variation occurs in the line widths of the resist pattern).

Furthermore, when a pyroelectric substrate is used, the problems described below may also occur. That is, increases and decreases in temperature are repeatedly performed in a sequential process of resist coating, exposure, a PEB treatment, and other process. According to the change in temperature as described above, a high voltage is generated in the pyroelectric substrate, and hence, discharges therefrom occur in many cases. Due to the discharges described above, for example, a resist having electron beam sensitivity partially reacts, and non-reacted portions are present together with unintentionally reacted portions in the resist, a resist having uniform characteristics cannot be obtained.

SUMMARY OF THE INVENTION

To overcome the above described problems with the prior art, preferred embodiments of the present invention provide a resist pattern which reduces the effects of standing waves, and is produced by the interference between incident light and reflected light, in a photolithographic process of a lift off method to provide fine wiring patterns, and provide a method for providing wiring using the resist pattern described above. In addition, even where a pyroelectric substrate is used as a substrate, preferred embodiments of the present invention provide a resist pattern having uniform characteristics.

The resist pattern provided on a substrate, includes a substrate, a first resist layer provided on the substrate and defined by a first organic material which dissolves in an organic solvent, water, or a solvent primarily composed of water, a second resist layer defined by a second organic material provided on the first resist layer, the second organic material having a high absorbance of a light of a particular wavelength, and a third resist layer defined by a third organic material provided on the second resist layer, the organic material having a resistance to dry etching and being photosensitive to the light.

The method for providing a wiring pattern, preferably includes the steps of forming a first resist layer on the substrate, the first resist layer being defined by a first organic material which dissolves in an organic solvent, water, or a solvent primarily composed of water, forming a second resist layer on the first resist layer, the second resist layer being defined by a second organic material which has a high absorbance of a light having a particular wavelength, and forming a third resist layer on the second resist layer, the third resist layer being defined by a third organic material provided which has a resistance to dry etching and is photosensitive to the light, exposing the third resist layer using the light through a mask pattern having an opening, developing the third resist layer to provide the opening therein, etching the second and third resist layers via the opening of the first resist layer such that the opening extends to the substrate, thereby forming a resist pattern having the opening, and forming a metal wiring pattern on the substrate through the resist pattern.

The substrate may have a pyroelectric property, and the first organic material preferably has no electron beam sensitivity.

The first, second and third organic materials may have heat resistivity. The first, second and third organic materials preferably do not deform at a temperature of at least approximately 140° C. The first organic material preferably includes polydimethyl glutarimide.

The first, second and third resist patterns preferably have an opening that exposes the substrate and has a tapered shape.

As is apparent from the description above, according to the resist pattern and to the method for forming wiring of various preferred embodiments of the present invention, since a material is used for the first resist layer, which easily dissolves in an organic solvent and has superior stripability, and a material is used for the third resist layer, which has high resistance to dry etching, a resist pattern is provided which has inversely tapered cross-sectional shapes and is easily stripped off by a solvent, as is obtained by conventional techniques. Since the resist pattern also has superior heat resistance, patterns of metal wiring, an inorganic compound, and an organic compound are formed at a high temperature. In addition, since the second resist layer is defined by a material having a high level of absorbance of exposure wavelengths, incident light passing through the third resist layer disposed at an upper side is absorbed in the second resist layer, and light does not reflect from the substrate. As a result, the effects of standing waves caused by the interference between the incident light and the reflected light is greatly reduced, unlike in conventional techniques. Hence, a resist pattern suitable for forming very fine wiring is obtained. Furthermore, where a transparent substrate having a roughened rear surface is used, since incident light passing through the third resist layer is absorbed in the second resist layer, diffuse reflection does not occur at the rear surface of the substrate, and hence, variations in the line widths of the patterns are greatly reduced. In addition, when a resist pattern having the structure of various preferred embodiments of the present invention is used, and when a PEB treatment is also performed, the occurrence of wave shapes at side surfaces of the openings in the resist, which are caused by the effects of standing waves, is greatly reduced and minimized.

In addition, when a resist pattern is provided on a pyroelectric substrate, by using a material having high solubility in an organic solvent and having no electron beam sensitivity for the first resist layer described above, a resist pattern having uniform characteristics is provided in which non-reacted portions and reacted portions are not present together in the pattern.

In addition, by using a material for the first resist layer, which has high solubility in water or a solvent primarily composed of water, the quantity of an organic solvent used is greatly reduced, and a production process which is much less detrimental to the environment is achieved.

Furthermore, by providing wiring using the resist pattern of preferred embodiments of the present invention, finer line widths are accurately provided in accordance with the designed fine wiring, compared to that provided by the conventional method, and hence, a method for forming wiring is provided which is suitable to produce miniaturized electronic devices and for greatly improving the high frequency characteristics thereof.

For the purpose of illustrating the invention, there is shown in the drawings several forms which are presently preferred, it being understood, however, that the invention is not limited to the precise arrangements and instrumentalities shown.

Other features, elements, characteristics and advantages of the present invention will become more apparent from the detailed description of preferred embodiments thereof with reference to the drawings.

DETAILED DESCRIPTION OF PREFERRED EMBODIMENTS

Hereinafter, preferred embodiments of the present invention are explained in detail with reference to the drawings.

Figure 3:
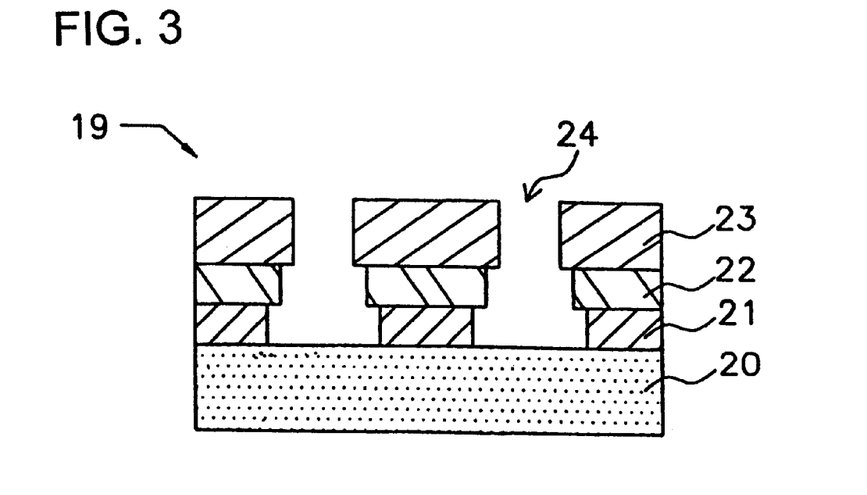
FIG. 3 is a cross-sectional view showing a resist pattern according to a preferred embodiment of the present invention.

A cross-sectional view of a resist pattern 19 of a preferred embodiment of the present invention is first shown in FIG. 3. In FIG. 3, reference numeral 20 indicates a substrate, reference numeral 21 indicates a first resist layer, reference numeral 22 indicates a second resist layer, and reference numeral 23 indicates a third resist layer, respectively. The resist pattern 19 is defined by the first to the third layers that are stacked one on the other. In the resist pattern 19, openings 24 are provided which extend to the substrate 20, and metal wiring is provided on the substrate 20 via the openings 24. It is preferable that the opening 24 in the first resist is larger than the opening in the second resist layer 22, and the opening 24 of the second resist layer 22 is larger than the opening in the third resist layer 23, thereby the resist pattern 19 has a reverse tapered shape in the cross section thereof. In other words, the openings 24 of the resist pattern 19 has a tapered shape.

The first resist layer 21 is preferably defined by an organic material having high solubility in an organic solvent, water, or a solvent primarily composed of water. The third resist layer 23 is preferably defined by an organic material which has a photosensitivity with respect to light or an electron beam having a specific wavelength and has high resistance to dry etching. The third resist layer 23 may be either a positive type or negative type. The second resist layer 22 is provided on an organic material which absorbs the light or electron beam used to expose the third resist layer 23. The absorbance of the second resist layer at the wavelength of the light is preferably about 50% or more.

According to the resist pattern having the structure described above, since the first resist layer is defined by a material which easily dissolves in an organic solvent, water, or a solvent primarily composed of water, and has high stripability, and the third resist layer is defined by a material which has high resistance to dry etching, a resist pattern is formed which has inversely tapered cross-sectional shapes and is easily stripable by a solvent, as is the conventional technique. In addition, since the resist pattern has superior heat resistance, patterns of metal wiring, an inorganic compound, an organic compound, and other such elements are formed at a higher temperature. Furthermore, in preferred embodiments of the present invention, since the second resist layer is defined by a material having a high level of absorbance of exposure wavelengths, incident light passing through the third resist layer disposed at an upper side is absorbed in the second resist layer and light does not reflect from the substrate. Where a transparent substrate having a roughened rear surface is used, since incident light is absorbed in the second resist layer, diffuse reflection at the rear surface of the substrate is greatly reduced, whereby variation in the line widths of the resist pattern are greatly reduced. Accordingly, the effects of standing waves caused by the interference between the incident light and the reflected light, and the diffuse reflection at the transparent substrate having a roughened rear surface are minimized and greatly reduced. In preferred embodiments of the present invention, when a resist pattern having the structure described above is used, and in addition, when a PEB treatment is also performed, wave shapes on the side surfaces of the openings in the resist are minimized.

Where a resist pattern is provided on a pyroelectric substrate, when a material is used for the first resist layer, having high solubility in an organic solvent, water, or a solvent primarily composed of water, and having no electron beam sensitivity, a resist pattern having uniform characteristics is provided in which non-reacted portions and reacted portions are not present together in the pattern.

The first resist layer, the second resist layer and the third resist layer may also have heat resistance. Sufficient heat resistance is ensured for the overall resist pattern. Polydimethyl glutarimide is one of the preferable materials for the first resist layer. Accordingly, by forming wiring using the resist pattern described above under high temperature conditions, highly reliable wiring is effectively formed having finer and desired, more accurate line widths and having superior adhesion to the substrate.

It is to be noted that the term "having heat resistance" means that the first, the second, and the third resists have resistance to heat distortion (properties of withstanding heat distortion) to prevent substantial deformation in a process of forming the film.

The resist pattern according to preferred embodiments of the present invention is suitable for forming wiring patterns. By forming wiring using the resist pattern of preferred embodiments of the present invention, finer wiring is formed with a high degree of accuracy in accordance with desired line widths, compared to that formed by the conventional technique. As a result, a method for forming wiring is provided which is suitable for miniaturizing electronic devices and for greatly improving high frequency characteristics thereof. It is to be noted that the metal wiring may be formed by various methods for forming metal films, such as a deposition method and a sputtering method.

Where the first to third resist layers of the resist pattern are provided on a material having a high heat resistance, the resist pattern is stable at a temperature of at least approximately 140° C. Thus, by forming the metal film while the substrate is maintained at a temperature of at least approximately 140° C. to form the metal wiring on the substrate, highly reliable metal wiring is formed having superior adhesion to the substrate, and hence, the present invention is effectively used.

A method for forming the resist pattern 19 of preferred embodiments of the present invention and a method for forming wiring using the resist pattern 19 will be described with reference to FIGS. 4A to 4F.

Figure 4A:
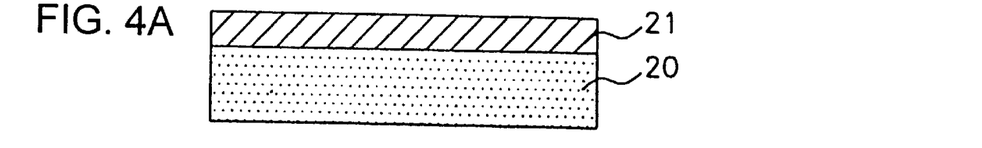
FIGS. 4A to 4F are cross-sectional views of manufacturing steps for a resist pattern and for wiring according to a preferred embodiment of the present invention.

As shown in FIG. 4A, the first resist layer 21 preferably having a thickness of approximately 0.15 $\mu$m is first provided on the substrate 20 by spin coating. Subsequently, a baking treatment is performed at approximately 170° C. for about 5 minutes. For the first resist layer 21, an organic material having high solubility in an organic solvent is preferably used, which is composed of, for example, polymethyl methacrylate (PMMA). In particular, OEBR-1000 manufactured by Tokyo Ohka Kogyo Co., Ltd., is preferably used. This type of material is preferable since the solubility of the material in an organic solvent is not decreased, even by a thermal load imposed on the material in a process of forming metal wiring described below.

Figure 4B:
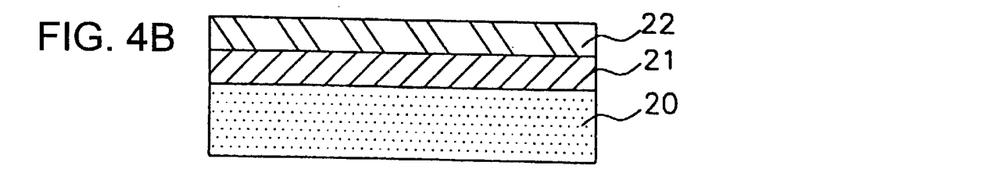

Next, as shown in FIG. 4B, the second resist layer 22 having a thickness of approximately 0.16 $\mu$m is preferably formed on the first resist layer 21 by spin coating. Subsequently, a baking treatment is performed at approximately 155° C. for about 1 minute. For the second resist layer 22, an organic material having a high level of absorbance of exposure wavelengths is used. The material to be used may be optionally selected in accordance with an exposure wavelength to be used, and for example, XHRi-11 manufactured by Brewer Science, Inc., has a high level of absorbance at an exposure wavelength of about 365 nm.

Figure 4C:
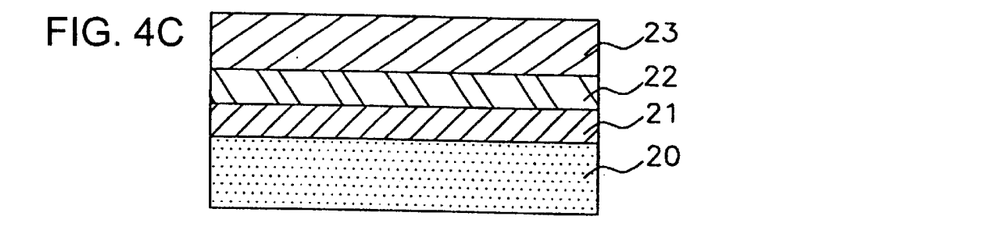

Next, as shown in FIG. 4C, on the second resist layer 22, the third resist layer 23 having a thickness of approximately 0.34 $\mu$m is preferably formed by spin coating.

Subsequently, a baking treatment is performed at approximately 90° C. for about 1 minute. For the third resist layer 23, an organic material having high resistance to dry etching is preferably used. In particular, Fi-SP2 manufactured by Fuji Film Olin Co., Ltd., is preferably used.

Figure 4D:
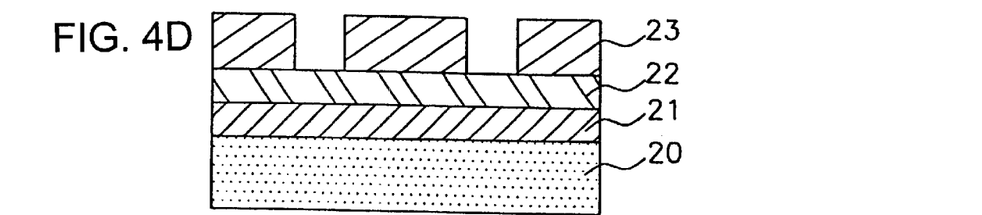

Next, exposure and developing are performed on the resist, whereby a pattern is formed in the third resist layer 23, as shown in FIG. 4D. In this step, since the second resist layer absorbs the exposure wavelengths, the light is not reflected from the substrate 20, thereby reducing the problems described above caused by the effects of standing waves and the diffuse reflection. As a result, a resist pattern is provided having superior resolution and finer widths of the openings.

Figure 4E:
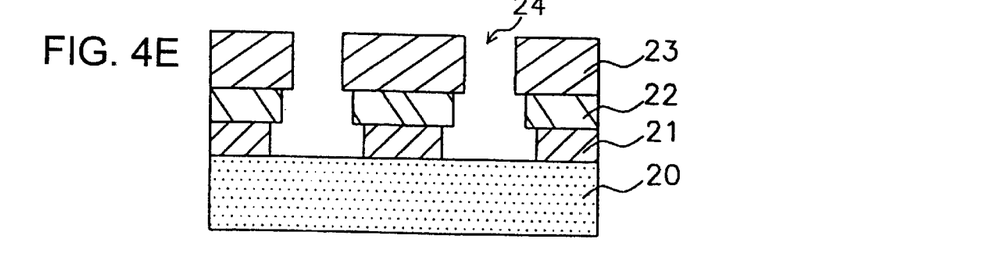

Next, dry etching (RIE) is performed using oxygen plasma on the three-layer resist described above. By the step mentioned above, the second and the first resist layers are removed through the openings in the third resist layer 23, thereby forming the pattern. In this step, since the third resist layer 23 has high resistance to dry etching, the etching rate thereof is very low, and on the other hand, the second and the first resist layers are removed by etching at normal etching rates, whereby, as a result, a resist pattern as shown in FIG. 4E is obtained having inversely tapered cross-sectional shapes. The detailed RIE etching conditions are such that the process gas is $O_2$, the pressure for processing is approximately 6.7 Pa, the RF power is approximately 300 W, and the processing time is approximately 2 minutes.

Figure 4F:
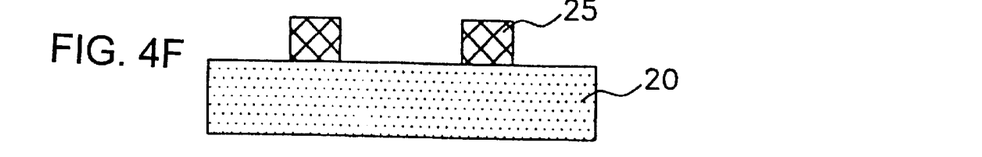

Next, by using the resist pattern thus provided, aluminum is deposited at a thickness of approximately 0.4 $\mu$m, and the resist pattern is stripped off by immersing the substrate in an organic solvent, such as acetone. In this step, since a material having superior stripability is used for the first resist layer, without performing an additional treatment such as a treatment for applying ultrasonic waves, the resist is totally stripped off in a short period of time, such as approximately 10 minutes. Accordingly, a fine aluminum pattern 25 having a line width of approximately 0.3 μm and a film thickness of approximately 0.4 μm is formed without burrs (FIG. 4F).

The aluminum pattern 25 thus formed is used for, for example, electrodes for surface acoustic wave devices.

Figure 5A:
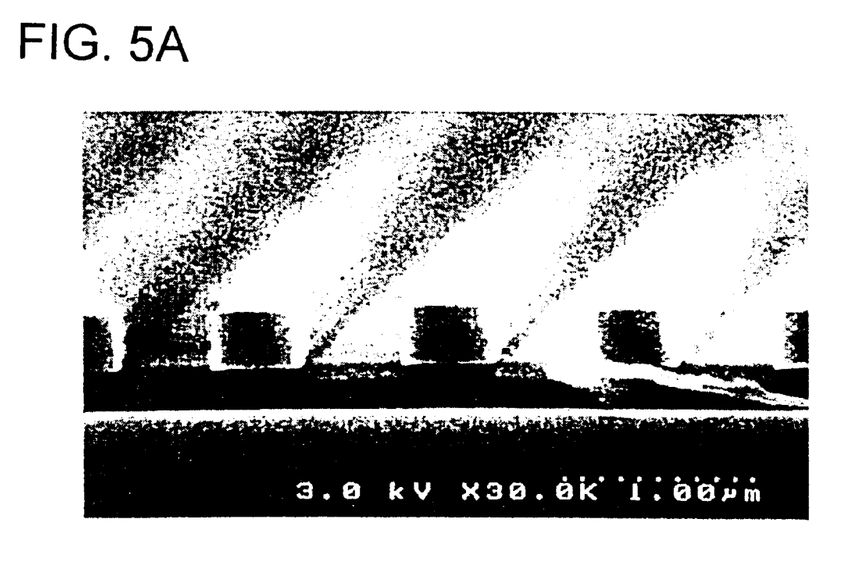
FIGS. 5A and 5B are SEM photographs according to a preferred embodiment the present invention and according to a conventional method, respectively.
Figure 5B:
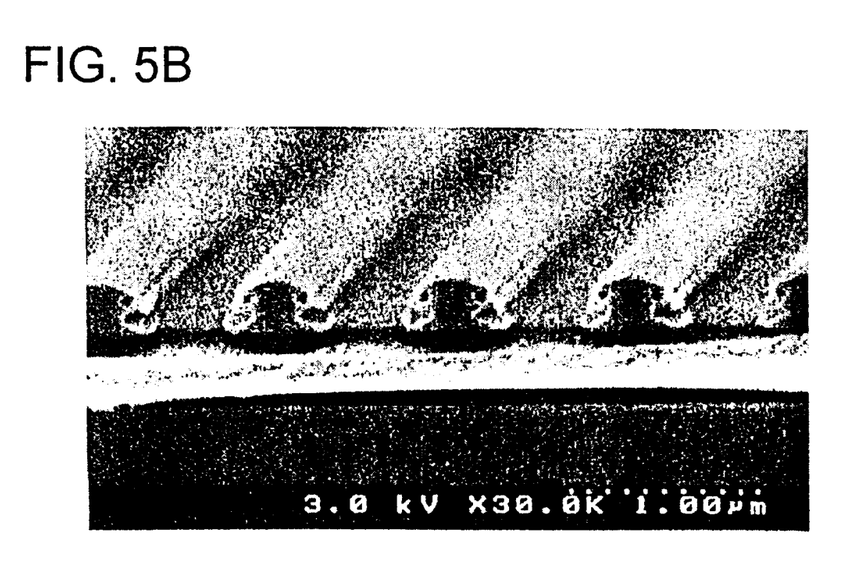

The aluminum pattern 25 obtained in this preferred embodiment is compared to that obtained by using a resist pattern having a conventional structure shown in FIG. 4. As a result of the comparison, compared to a resolution limit of 0.5 μm in line width obtained for the resist having the conventional structure, the resolution limit of the resist according to this preferred embodiment is substantially reduced to approximately 0.3 μm, which is provided with the second resist layer having light absorbing characteristics. In addition, SEM photographs comparing cross-sectional shapes of the resists are shown in FIG. 5A having a line and space of approximately 0.5 μm. As can be seen from FIG. 5B, the side surfaces (of the third resist layer) of the resist having the conventional structure are formed to have wave shapes, and on the other hand, the side surfaces of the resist according to preferred embodiments of the present invention are formed to be approximately vertical.

As shown in the figures, according to the resist pattern of preferred embodiments of the present invention, when the resist pattern includes a plurality of layers, and when the layered structure is optimized via superior stripability, minimization of the effects of standing waves (higher resolution of the pattern), and providing inversely tapered cross-sectional shapes, metal wiring having higher resolution are achieved in a very short period of time.

In the formation of the resist pattern having a three-layer structure according to preferred embodiments of the present invention, in addition to the selection of the resist based on stripability, light absorbing characteristics, and resistance to dry etching, the resists are selected to initially provide a resist having the highest etching rate on the substrate and sequentially provide resists in a descending order of etching rate. Accordingly, a resist having inversely tapered cross-sectional shapes is effectively provided.

The resist pattern of a second preferred embodiment is provided with a high heat resistance.

As shown in FIG. 4A, the first resist layer 21 having a thickness of approximately 0.12 μm is first formed on the substrate 20 by spin coating. Subsequently, a baking treatment is performed at approximately 170° C. for about 20 minutes on the substrate 20 provided with the first resist layer 21 provided thereon.

In this step, for the first resist layer 21, an organic material having high solubility in an organic solvent and having superior heat resistance is preferably used. The first resist layer 21 is preferably composed of, for example, polydimethyl glutarimide (PMGI). This type of material is used, because the resist pattern is not deformed even by a thermal load imposed thereon in a process of forming metal wiring described below, and in addition, the solubility of the material in an organic solvent is not significantly decreased.

Next, as shown in FIG. 4B, the second resist layer 22 having a thickness of 0.16 μm is preferably formed on the first resist layer 21 by spin coating. Subsequently, a baking treatment is performed at about 155° C. for 1 minute for the substrate 20 provided with the second resist layer 22.

In this step, for the second resist layer 22, an organic material is used having a high level of absorbance of exposure wavelengths and having superior heat resistance. As the organic material described above which is to be used, a material may be optionally selected in accordance with an exposure wavelength to be used, and for example, when the exposure wavelength is approximately 365 nm, XHRi-16 manufactured by Brewer Science, Inc., is preferably used since it has a high level of absorbance.

Next, as shown in FIG. 4C, on the second resist layer 22, the third resist layer 23 having a thickness of approximately 0.34 μm is provided by spin coating. Subsequently, a baking treatment is performed at approximately 90° C. for about 1 minute for the substrate 20 provided with the third resist layer 23.

In this step, for the third resist layer 23, an organic material is used having high resistance to dry etching and having superior heat resistance. As the organic material described above, in particular, Fi-SP2 manufactured by Fuji Film Olin Co., Ltd., may be used.

Next, exposure and developing are performed on the resist having the three-layer structure thus provided, whereby a pattern is provided in the third resist layer 23, as shown in FIG. 4D.

In this step, since the second resist layer absorbs the exposure wavelengths, a resist pattern has superior resolution and finer widths of the openings.

In addition, a UV cure treatment is performed to improve the heat resistance of the resist pattern.

Next, dry etching (RIE) is performed using oxygen plasma on the three-layer resist having the third resist layer 23 provided with the pattern therein as described above. By the step mentioned above, portions of the second resist layer 22 and portions of the first resist layer 21 are removed through the openings in the third resist layer 23, whereby patterning is performed.

In this step, since the third resist layer 23 has high resistance to dry etching, the etching rate thereof is greatly reduced, and the second resist layer 22 and the first resist layer 21 are removed by etching at normal etching rates, as a result, a resist pattern as shown in FIG. 4E is obtained having inversely tapered cross-sectional shapes.

The detailed RIE etching conditions are set as shown below.

Process gas: $O_2$
Pressure for processing: 6.7 Pa
RF power: 300 W
Processing time: 3 minutes.

Next, by using the resist pattern thus provided, aluminum is deposited on the substrate 20, and an aluminum film having a thickness of approximately 0.2 μm is provided. In this step, when the aluminum film is provided, to improve the adhesion thereof to the substrate 20, deposition is performed while the substrate is maintained at approximately 190° C. by heating.

In this step, since the resist layers defining the resist pattern have superior heat resistance, aluminum is deposited without deformation of the resist pattern.

Next, the resist pattern is stripped off by immersing the substrate in an organic solvent. By the step described above, as shown in FIG. 4F, a fine aluminum pattern 25 is provided having superior adhesion to the substrate 20 and having a desired line width and a film thickness. In this step, the aluminum pattern 25 is provided having a line width of approximately 0.3 μm and a film thickness of approximately 0.4 μm.

The aluminum pattern 25 thus formed is preferably used for, for example, electrodes for surface acoustic wave devices.

Since, in the resist pattern 19 (FIG. 3) provided in the preferred embodiment described above, the resist layers 21, 22, and 23 are composed of materials each having superior heat resistance, the heat resistance of the overall resist pattern having the three-layer structure is greatly improved. In addition, since an organic material is used for the first resist layer 21, having high solubility in an organic solvent and having superior heat resistance, both heat resistance and stripability are greatly improved.

Figure 6A:
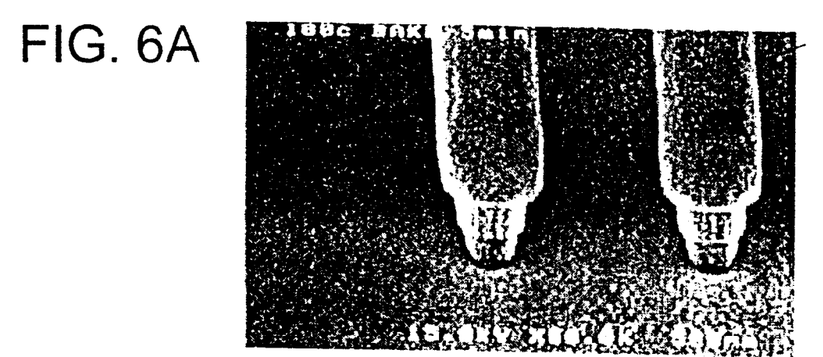
FIGS. 6A to 6C are SEM photographs showing heat resitivities.
Figure 6B:
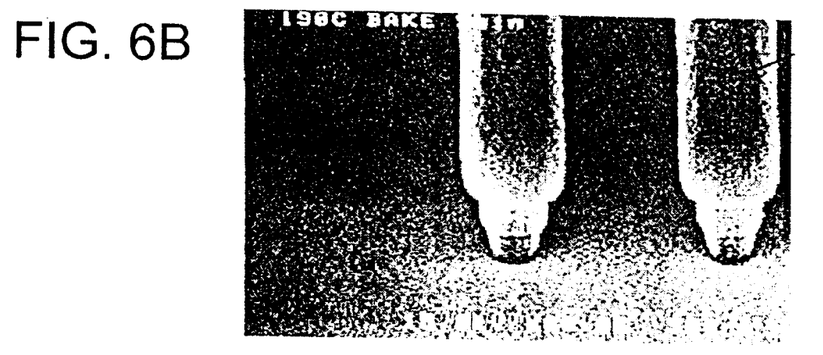
Figure 6C:
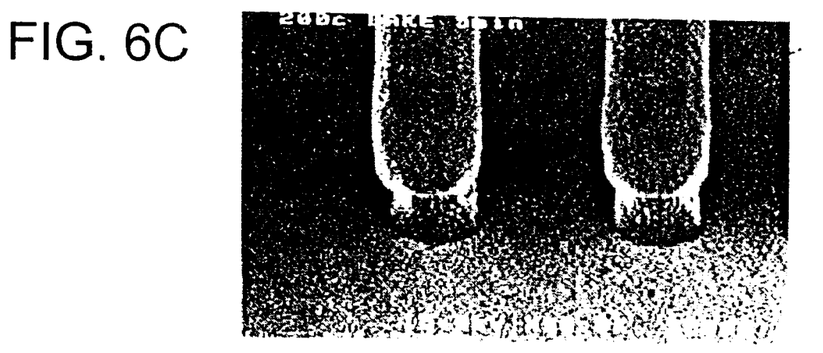

In addition, the results of heating tests performed by using a hot plate for the resist patterns formed by the method described in the above preferred embodiment are shown in FIGS. 6A to 6C. FIGS. 6A to 6C are SEM photographs, in which FIG. 6A shows a resist pattern heated to approximately 180° C. for about 5 minutes, FIG. 6B shows a resist pattern heated to approximately 190° C. for about 5 minutes, and FIG. 6C shows a resist pattern heated to approximately 200° C. for about 5 minutes.

As shown in FIGS. 6A to 6C, it is confirmed that when the resist pattern formed by the method described in the above preferred embodiment is heated to approximately 200° C., the first resist layer is deformed. However, it is also confirmed that when the resist patterns are heated to approximately 180 and approximately 190° C., respectively, in addition to the first resist layer, the second and the third resist layers are not deformed.

In addition, in the preferred embodiment described above, a UV cure treatment is performed after the third resist layer is patterned. However, depending on the dry etching conditions by using oxygen plasma, effects of UV irradiation and effects of heating is imparted to the second resist layer and the third resist layer, and as a result, an effect equivalent to the UV cure treatment is obtained. In the preferred embodiment described above, it is unnecessary to perform the UV cure treatment.

Furthermore, in the preferred embodiment described above, as a method for forming a metal film, a deposition method is preferably used. However, when a metal film is provided by a sputtering method or a CVD method, the same effect as that of the deposition method is obtained.

In a resist pattern of the third preferred embodiment according to the present invention, features differing from those of the first preferred embodiment are that a pyroelectric substrate is used, and an organic material, which has high solubility in an organic solvent and has no electron beam sensitivity, is used for a first resist layer. The other points are substantially equivalent to those of the first preferred embodiment. Hereinafter, the third preferred embodiment will be described mainly focusing on the different points described above.

A substrate composed of $LiTaO_3$ is first prepared as a pyroelectric substrate, and a first resist layer approximately 0.10 μm thick is preferably formed on the pyroelectric substrate by spin coating. Subsequently, a baking treatment is performed at approximately 170° C. for about 5 minutes. For the first resist layer, an organic material having no electron beam sensitivity is used.

Next, in a manner similar to that described in the first preferred embodiment, a second resist layer and a third resist layer are formed by spin coating, and exposure, developing, and dry etching (RIE) are then sequentially provided. The detailed RIE etching conditions are such that the process gas is $O_2$, the pressure for processing is approximately 6.7 Pa, the RF power is approximately 300 W, and the processing time is about 2 minutes.

Next, by using the resist pattern thus obtained, aluminum is deposited at a thickness of approximately 0.4 μm, and the resist pattern is stripped off by immersing the substrate in an organic solvent (Clean Strip, manufactured by Tokyo Ohka Kogyo Co., Ltd.) at approximately 110° C. In this stripping, the resist is totally stripped off in a short period of time, such as approximately 10 minutes, without performing an additional treatment such as a treatment for applying ultrasonic waves. Accordingly, a fine aluminum pattern having a line width of approximately 0.3 μm and a film thickness of approximately 0.4 μm provided without burrs.

As described above, by using an organic material having no electron beam sensitivity for the first resist layer, the problems experienced in the prior art (that is, the characteristics of the resist tend to be nonuniform, and the line widths of wiring tend to be nonuniform, which problems are caused by discharges generated by expansion and contraction of the pyroelectric substrate) are minimized, and fine metal wiring provided having a line width of approximately 0.3 μm.

In a resist pattern of the fourth preferred embodiment according to the present invention, a feature differing from that of the first preferred embodiment is that an organic material is used for a first resist layer having high solubility in water or in a solvent primarily composed of water, and the other points are substantially equivalent to those of the first preferred embodiment. Hereinafter, the fourth preferred embodiment will be described focusing on the different feature described above.

A first resist layer having a thickness of approximately 0.30 μm is first preferably formed on a substrate by spin coating. Subsequently, a baking treatment is performed at approximately 150° C. for about 90 seconds. For the first resist layer, an organic material is used having high solubility in water or in a solvent primarily composed of water, which is composed of, for example, polyvinyl alcohol (PVA). In particular, TPF manufactured by Tokyo Ohka Kogyo Co., Ltd., is preferably used, which is primarily composed of polyvinyl alcohol. This type of material is used because the solubility of the material in water is not decreased even by a thermal load imposed on the material in a process for forming metal wiring described below. In addition, Barrier Coat manufactured by Shin-Etsu Chemical Co., Ltd., which is also primarily composed of polyvinyl alcohol, may also be used for the first resist layer. By using this material a relatively thin film thereof is provided, and in particular, a film approximately 0.10 μm thick is provided by spin coating.

Next, on the first resist layer, a second resist layer approximately 0.16 μm thick is preferably formed by spin coating. Subsequently, a baking treatment is performed at approximately 150° C. for about 90 seconds. For the second resist layer, an organic material having a high level of absorbance of exposure wavelengths is preferably used. A material to be used may be optionally selected in accordance with an exposure wavelength to be used, and for example, XHRi-16 manufactured by Nissan Chemical Industries Ltd., has a high level of absorbance at an exposure wavelength of approximately 365 nm. As described above, since a material having a high level of absorbance of exposure wavelengths is used for the second resist layer, light is not reflected from the substrate 20, and a resist pattern is provided having superior resolution and finer widths of the openings.

Furthermore, the second resist layer prevents the first resist layer from being mixed with the third resist layer, and in addition, the second resist layer prevents the first resist layer, which has high solubility in water or in a solvent primarily composed of water, from dissolving when the third resist layer is developed by using an acid or an alkaline agent.

Next, in a manner equivalent to that of the first preferred embodiment, the third resist layer is provided using spin coating, and exposure, developing, and dry etching (RIE) are then sequentially performed. The detailed RIE etching conditions are such that the process gas is $O_2$, the pressure for processing is approximately 6.7 Pa, the RF power is approximately 300 W, and the processing time is about 2 minutes.

Next, by using the resist pattern thus obtained, aluminum is deposited at a thickness of about 0.4 μm, and the resist pattern is then stripped off by immersing the substrate in an aqueous solution containing isopropyl alcohol (8 wt %) at approximately 60° C. The reason the aqueous solution containing isopropyl alcohol is used, as described above, is to prevent the resist pattern stripped off from redepositing on the substrate. In this stripping, the resist is entirely stripped off in a short period of time, such as approximately 10 minutes, without performing an additional treatment such as a treatment for applying ultrasonic waves. Accordingly, a fine aluminum pattern having a line width of approximately 0.3 μm and a film thickness of approximately 0.4 μm is provided without burrs.

In the step of stripping the resist pattern described above, the substrate is preferably immersed in an aqueous solution containing isopropyl alcohol. However, regular water may be used which does not contain a solvent as long as the redeposition of the resist pattern on the substrate is prevented. In addition, when a hydrophilic solvent or a surfactant is added instead of isopropyl alcohol, the same effect is obtained as that obtained by using isopropyl alcohol.

As described above, by using a material for the first resist layer, which has high solubility in water or a solvent primarily composed of water, the quantity of an organic solvent used is minimized, and a production process which is less detrimental on the environment is achieved.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A resist pattern provided on a substrate, comprising:
   a substrate;
   a first resist layer provided on the substrate and defined by a first organic material which dissolves in an organic solvent, water, or a solvent primarily composed of water;
   a second resist layer defined by a second organic material provided on the first resist layer, the second organic material having a high absorbance of a light having a predetermined wavelength; and
   a third resist layer defined by a third organic material provided on the second resist layer, the organic material having a resistance to dry etching that is greater than a resistance to dry etching of the first resist layer and being photosensitive to the light.

2. A resist pattern according to claim 1, wherein the substrate has a pyroelectric property, and the first organic material substantially has no electron beam sensitivity.

3. A resist pattern according to claim 1, wherein each of the first, second and third organic materials has a heat resistivity.

4. A resist pattern according to claim 3, wherein the first, second and third organic materials do not deform at a temperature of at least approximately 140° C.

5. A resist pattern according to claim 3, wherein the first organic material comprises polydimethyl glutarimide.

6. A resist pattern according to claim 1, wherein the first, second and third resist patterns have an opening which exposes the substrate, and the opening has a tapered shape.

7. A method for forming a wiring pattern, comprising the steps of:
   providing a substrate;
   forming a first resist layer on the substrate, said first resist layer being defined by a first organic material which dissolves in an organic solvent, water, or a solvent primarily composed of water;
   forming a second resist layer on the first resist layer, the second resist layer being defined by a second organic material which has a high absorbance of a light having a predetermined wavelength; and
   forming a third resist layer on the second resist layer, the third resist layer being defined by a third organic material provided which has a resistance to dry etching that is greater than a resistance to dry etching of the first resist layer and is photosensitive to the light.

8. A method for forming a wiring pattern according to claim 7, further comprising:
   exposing the third resist layer using the light transmitted through a mask pattern having an opening;
   developing the third resist layer to form an opening therein;
   etching the second and third resist layers via the opening of the third resist layer such that the opening reaches to the substrate, thereby forming a resist pattern having the opening; and
   forming a metal wiring pattern on the substrate through the resist pattern.

9. A method for forming a wiring pattern according to claim 7, wherein the substrate has a pyroelectric property, and the first organic material substantially has no electron beam sensitivity.

10. A method for forming a wiring pattern according to claim 7, wherein each of the first, second and third organic materials has a heat resistivity.

11. A method for forming a wiring pattern according to claim 10, wherein the first, second and third organic materials do not deform at a temperature of at least approximately 140° C.

12. A method for forming a wiring pattern according 11, wherein the metal wiring pattern is formed on the substrate while keeping the substrate at a temperature of at least approximately 140° C.

13. A method for forming a wiring pattern according to claim 10, wherein the first organic material comprises polydimethyl glutarimide.

14. A method for forming a wiring pattern according to claim 7, wherein the opening has a tapered shape.

* * * * *